United States Patent [19]

Pinkhasov

[11] Patent Number: 4,537,794
[45] Date of Patent: Aug. 27, 1985

[54] METHOD OF COATING CERAMICS

[75] Inventor: Eduard Pinkhasov, Mt. Vernon, N.Y.

[73] Assignee: Wedtech Corp., Bronx, N.Y.

[21] Appl. No.: 626,056

[22] Filed: Jun. 29, 1984

Related U.S. Application Data

[63] Continuation-in-part of Ser. No. 614,434, May 25, 1984, Pat. No. 4,505,948, which is a continuation-in-part of Ser. No. 494,302, May 13, 1983, which is a continuation-in-part of Ser. No. 358,186, Mar. 15, 1982, Pat. No. 4,438,153, which is a continuation-in-part of Ser. No. 237,670, Feb. 24, 1981, Pat. No. 4,351,855.

[51] Int. Cl.$^3$ .......................... B05B 1/24; C23C 13/00
[52] U.S. Cl. ...................................... 427/37; 118/723; 118/726; 427/250; 427/295; 427/422
[58] Field of Search ................. 427/37, 250, 295, 422, 427/34, 423, 404; 118/720, 723, 726, 50.1

[56] References Cited

U.S. PATENT DOCUMENTS

| | | | |
|---|---|---|---|
| 2,588,421 | 3/1952 | Shepard | 427/404 |
| 3,010,009 | 11/1961 | Ducati . | |
| 3,340,084 | 9/1967 | Eisenlohr | 427/423 |
| 3,491,015 | 1/1970 | Naff . | |
| 4,197,175 | 4/1980 | Moll et al. | 118/723 |

FOREIGN PATENT DOCUMENTS

| | | |
|---|---|---|
| 1636004 | 7/1971 | Fed. Rep. of Germany . |
| 1648968 | 10/1971 | Fed. Rep. of Germany . |
| 822793 | 9/1937 | France . |
| 979772 | 12/1950 | France . |
| 1400961 | 4/1965 | France . |
| 889018 | 2/1962 | United Kingdom . |
| 1061949 | 3/1967 | United Kingdom . |
| 1322670 | 7/1973 | United Kingdom . |
| 1392583 | 4/1975 | United Kingdom . |
| 1447224 | 8/1976 | United Kingdom . |
| 1452720 | 10/1976 | United Kingdom . |
| 2010919 | 7/1979 | United Kingdom . |
| 2055403 | 3/1981 | United Kingdom . |
| 2058843 | 4/1981 | United Kingdom . |
| 2093484 | 9/1982 | United Kingdom . |
| 2106545 | 4/1983 | United Kingdom . |

OTHER PUBLICATIONS

Article, "Nickel Ferrite Thick Films Deposited by Vacuum-Arc Discharge", by Masahiko Naoe et al., Tokyo Institute of Technology, (1979), (in English).

Primary Examiner—John H. Newsome
Attorney, Agent, or Firm—Karl F. Ross; Herbert Dubno

[57] ABSTRACT

The adhesion of conductive layers to ceramic substrates in the application of such layers by low-energy techniques is improved by interposing between the high-conductivity metal layer and the substrate a layer of a refractory metal which is preferably also applied by low-energy vaporization. The metal layers can be provided in succession by reversing the polarity of electrodes composed of the metals of these layers which strike an arc vaporizing the metal to be deposited.

12 Claims, 2 Drawing Figures

METHOD OF COATING CERAMICS

CROSS REFERENCE TO RELATED APPLICATIONS

This application is a continuation-in-part of my application Ser. No. 614,434 filed May 25, 1984 (U.S. Pat. No. 4,505,948). That application, in turn, is a continuation-in-part of an application Ser. No. 494,302 copending therewith and filed May 13, 1983. Ser. No. 494,302 was a continuation-in-part of U.S. Ser. No. 358,186 filed Mar. 15, 1982 (U.S. Pat. No. 4,438,153) as a continuation-in-part of Ser. No. 237,670 filed Feb. 14, 1981 (U.S. Pat. No. 4,351,855), all of which contain subject matter which in part is disclosed herein and which are all incorporated in their entireties by reference herein. This application also deals with subject matter found in or related to Disclosure Documents Nos. 078,377, 078,334, 078,329, all deposited in the U.S. Patent and Trademark Office on Feb. 26, 1979 and the Disclosure Document No. 082,283 deposited July 5, 1979, incorporated herein by reference.

FIELD OF THE INVENTION

My present invention relates to a method of coating ceramics and, more particularly, to a method of making metal coatings of conductive metals such as copper, gold and silver, upon ceramic substrates, which are especially adherent.

BACKGROUND OF THE INVENTION

The above-mentioned copending applications and disclosure documents relate to the depositing of material from a vapor phase on a substrate and are applicable to the coating of a wide variety of materials on a wide variety of substrates and particularly materials which have been difficult to apply heretofore in adherent coatings to substrates which have not generally been able to receive such coating without substantial alteration or various problems.

These documents in part have disclosed the coating of ceramics utilizing low-energy techniques with various coating materials including conductive layers so as to enable these ceramic bodies to be utilized in the semiconductor industry and to permit terminals, conductors or circuit elements to be applied to the coated regions by soldering or other fusion techniques.

The basic principle underlying these earlier methods was the generation of the vapor by the striking of a low-voltage arc between two electrodes, one of which at least was vaporized to produce the vapor phase component which was deposited upon the substrate, contacted by vapor in a vacuum chamber. The vapor could be generated by striking the arc between a pool of metal and a counterelectrode under conditions disclosed in some of those applications, or by striking the arc between two electrodes without significant pool formation as disclosed in others of these applications, and these applications generally also describe the formation of compounds which are to be deposited upon substrates by reaction of material from one electrode with material from the other as the electrode materials are vaporized. The application also describe how compounds can be formed between a vaporized metal and a carrier gas which can be introduced into the region of the arc.

Notwithstanding the advances represented in these earlier applications, including the advances in the coating of ceramics, the problem of coating certain high-conductivity metals such as gold and silver, but most notably copper, upon ceramics in economical and highly adherent coating such that the conductive coatings can withstand the rigors of afterheating, e.g. heating during the application of conductive elements by soldering or other thermal fusion, has remained.

OBJECTS OF THE INVENTION

It is, therefore, the principal object of the present invention to provide an improved method of coating ceramics whereby the disadvantages of earlier coating methods are avoided and, particularly, the resulting coatings are not only initially highly adherent to the ceramic substrate but withstand subsequent heating and rigorous handling.

Another object of this invention is to provide a method of coating ceramic substrates which extends the principles of the aforedescribed copending applications.

It is also an object of this invention to provide an improved coated ceramic article.

SUMMARY OF THE INVENTION

I have now found quite surprisingly that the disadvantages, which have hitherto been encountered when high conductivity metals, especially copper but also gold and silver, are applied to a ceramic substrate with respect to adhesion and especially with respect to adhesion after or during soldering or other welding of conductivity elements thereof, can be obviated if, prior to the application of the high conductivity metal, the ceramic is coated with a refractory metal in a comparatively small thickness and this intermediate layer of coating is in turn coated with the conductive metal.

More particularly, I have found that it is possible to deposit a coating or a thickness of, say, 5 to 10 microns of tungsten, molybdenum, titanium or zirconium as the refractory metal upon the substrate and thereafter to apply a coating of greater thickness, say 0.001 to 0.02 inch of copper or a copper alloy, gold, silver or some other nonrefractory metal, i.e. metal having a substantially lower boiling point than that of the refractory metal which is used.

Preferably, both coatings are applied utilizing the techniques described in the above-identified applications and especially Ser. No. 614,434. I have found that, when a two-electrode method is used, according to the invention, it is possible to constitute one electrode as the refractory metal and the other electrode as the nonrefractory metal and by regulating the polarity of the electrodes during the deposition, the particular metal which is deposited can be controlled.

With the present invention, I have found that it is possible to increase the adhesion, in terms of the force required to separate the coating from the substrate by 100 or more times, all other things being equal, when the thin refractory metal coating is applied between the copper coating and the ceramic substrate A ceramic substrate can be used in accordance with the present invention and masking techniques can be employed to ensure the formation of the deposit in any desired pattern.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
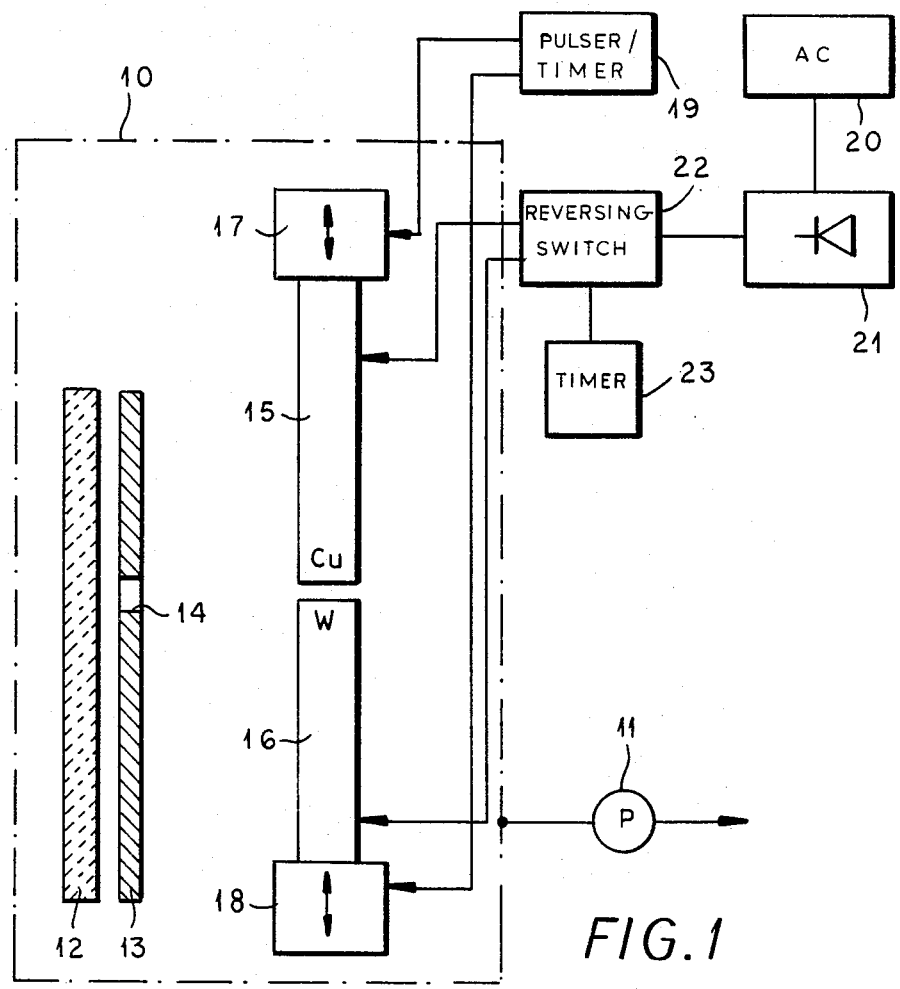
FIG. 1 is a diagram of an apparatus for carrying out the method of the present invention.

In FIG. 1 I have shown an apparatus, in a highly diagrammatic form, for carrying out the method of the invention. This apparatus, as described in the last mentioned copending application, comprises a chamber 10 which can be evacuated by suction pump 11 to the desired degree of vacuum, generally $10^{-5}$ to $10^{-6}$ torr. Within this chamber, by means not shown, a ceramic substrate 12 can be disposed and can be shielded by a mask diagrammatically illustrated at 13 so that coating can only occur in regions defined by the windows 14 in the mask.

Within the vacuum chamber the portion of the substrate to be coated is juxtaposed with a pair of electrodes, i.e. a copper electrode 15 and a tungsten electrode 16, the electrodes being provided with means such as the electromagnetic motors (solenoids) 17 and 18 for briefly bringing them into contact to strike the arc and then drawing them apart. Such means have been described in the aforementioned copending applications which, as noted, are hereby incorporated by reference. The pulser for periodically energizing the device 17 and 18 have been shown at 19.

The power supply comprises the alternating current source 20 which is connected to a rectifier 21 and the latter is provided with a reversing switch 22 which can reverse the polarity of the electrodes 15 and 16 under the control of a timer 23.

In operation with the copper electrode 15 poled positively and the tungsten 16 poled negatively an arc can be struck by passing an electric current of 30 to 100 amperes at a voltage of 40 to 100 volts through and across the gap after the electrodes briefly touch to preferentially vaporize tungsten and thus deposit tungsten through the window 14 of the mask 13 on the substrate. The duration of coating is controlled by the timer 23 which, after the coating of the order of microns in thickness has been applied, reverses the polarity so that the copper electrode 15 is now poled negatively and the tungsten electrode 16 is poled positively whereupon copper is vaporized from the electrode 15 and deposited upon the substrate.

Figure 2:
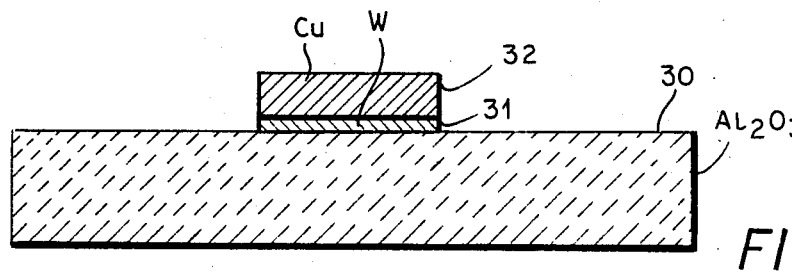
FIG. 2 is a cross-sectional view drawn to a larger scale of a product of the present invention.

As can be seen from FIG. 2, the resulting article has a substrate 30, e.g. of aluminum oxide, bearing a copper coating 32 which is separated by the refractory metal coating 31 (tungsten) of smaller thickness.

SPECIFIC EXAMPLE

Utilizing the principles described, a current of about 70 amperes, a voltage of 80 watts and a vacuum of about $10^{-5}$ torr, an aluminum oxide plate is coated with tungsten to a thickness of about 8 microns and with copper to a thickness of about 0.002 inches. The adhesion is measured and for the coating is found to be 500 to 700 lbs per square inch (force required to remove the coating). When under identical conditions a copper coating of the same thickness is applied to the same substrate, the adhesion is only 6 to 8 lbs per square inch. The direct copper-to-ceramic bond is found to be sensitive to both mechanical and thermal effects when a solder connection is made to it and with the copper/tungsten contact, formed according to the invention, no similar sensitivity was found.

Practically identical results could be obtained by substituting molybdenum, titaniums and zirconium for the tungsten and with combinations of these refractory metals with one another and with tungsten as intermediate layers. Similarly, high degrees of adhesion were obtained with gold, silver and alloys thereof with one another and with copper.

I claim:

1. A method of bonding a high conductivity metal to a ceramic which comprises the steps of:

applying to a ceramic substrate a thin bonding layer of a refractory metal; and thereafter applying said high conductivity metal to said layer, each of said metals being applied by striking an arc between a pair of electrodes to vaporize the respective metal from one of said electrodes in an evacuated chamber, an electrode of said refractory metal being juxtaposed with an electrode of said high-conductivity metal, said electrodes being brought into contact and drawn apart to strike said arc, and said electrodes being initially energized with positive and negative polarities in one sense to initially deposit said refractory metal on said substrate and the polarity being thereafter reversed to deposit said high-conductivity metal upon said substrate.

2. The method defined in claim 1 wherein said high-conductivity metal is copper, gold, silver or an alloy thereof.

3. The method defined in claim 2 wherein said refractory metal is tungsten, molybdenum, titanium, zirconium or an alloy or combination thereof.

4. The method defined in claim 3 wherein said refractory metal is applied to said substrate to a thickness of the order of microns and said high conductivity metal is applied in a thickness of substantially 0.001 to 0.02 inch.

5. The method defined in claim 4 wherein said high conductivity metal is applied in a thickness of substantially 0.001 to 0.002 inch and said refractory metal is applied in a layer of 5 to 10 microns.

6. The method defined in claim 5 wherein said high-conductivity metal is copper and said refractory metal is tungsten.

7. A method of bonding a multilayer coating to a substrate which comprises the steps of:

juxtaposing electrodes of two different metals with said substrate;

bringing said electrodes into contact and drawing them apart to strike an arc while initially energizing said electrodes with positive and negative polarities in one sense to initially deposit metal from one of said electrodes on said substrate;

thereafter reversing the polarity applied to said electrodes and bringing them into contact and drawing them apart to strike an arc to vaporize metal from the other of said electrodes and deposit same upon said substrate; and evacuating a chamber in which said arcs are struck to enable deposit of metal from said electrodes upon said substrate in respective layers.

8. The method defined in claim 7 wherein said substrate is a ceramic.

9. The method defined in claim 7 wherein said metal of said one of said electrodes is a refractory metal selected from the group which consists of tungsten, molybdenum, titanium, zirconium and alloys and combinations thereof.

10. The method defined in claim 7 wherein said metal of said other electrode is selected from the group which consists of copper, gold, silver and alloys thereof.

11. The method defined in claim 7 wherein the metal of said second electrode is applied in a thickness of substantially 0.001 to 0.02 inch to said layer of said metal of said first electrode and said metal of said first electrode is applied to said substrate in a thickness of substantially 5 to 10 microns.

12. A method of applying a multilayer metal coating to a ceramic substrate which comprises the steps of:

juxtaposing a pair of electrodes with a ceramic substrate in an evacuated chamber, said electrodes including a first electrode composed of a refractory metal selected from the group which consists of tungsten, molybdenum, titanium, zirconium and alloys and combinations thereof, and a second electrode composed of a high conductivity metal selected from the group which consists of copper, gold, silver and alloys thereof;

striking an arc between said electrodes and energizing same electrically initially with positive and negative polarities in a sense so as to vaporize metal from said one of said electrodes in said evacuated chamber and deposit the vaporized metal from said one of said electrodes on said substrate in a layer of a thickness of substantially 5 to 10 microns; and thereafter reversing the polarity of said electrodes and striking an arc between them to vaporize metal from said second electrode in said evacuated chamber thereby depositing said high conductivity metal on said refractory metal on said substrate in a thickness of substantially 0.001 to 0.02 inch.

* * * * *